US005527660A

United States Patent [19]

Teng

[11] Patent Number: 5,527,660
[45] Date of Patent: Jun. 18, 1996

[54] LAMINAR IMAGING MEDIUM UTILIZING HYDROPHOBIC CYCLOALIPHATIC POLYEPOXIDE IN THE FRACTURABLE LAYERS

[75] Inventor: Ganghui Teng, Bedford, Mass.

[73] Assignee: Polaroid Corporation, Cambridge, Mass.

[21] Appl. No.: 347,269

[22] Filed: Nov. 30, 1994

[51] Int. Cl.$^6$ .................................. G03F 7/11; G03F 7/34
[52] U.S. Cl. ....................... 430/253; 430/259; 430/273.1
[58] Field of Search ................................... 430/253, 259, 430/200, 273, 273.1

[56] References Cited

U.S. PATENT DOCUMENTS

| 3,117,099 | 1/1964 | Proops et al. | |
|---|---|---|---|
| 4,291,114 | 9/1981 | Berggren et al. | 430/253 |
| 5,043,221 | 8/1991 | Koleske | 428/413 |
| 5,190,697 | 3/1993 | Ohkita et al. | 252/511 |
| 5,200,297 | 4/1993 | Kelly | 430/253 |
| 5,200,456 | 4/1993 | Teyssié et al. | 524/430 |
| 5,328,798 | 7/1994 | McCarthy et al. | 430/200 |
| 5,342,731 | 8/1994 | Kelly et al. | 430/253 |

OTHER PUBLICATIONS

Union Carbide Promotional Material, *Cycloaliphatic Epoxide Systems*. Union Carbide Chemicals & Plastics Technology Corporation, 1989.

Primary Examiner—Charles L. Bowers, Jr.
Assistant Examiner—Christopher G. Young
Attorney, Agent, or Firm—Renato M. de Luna

[57] ABSTRACT

A peel-developable imaging medium for the imagewise recordation of information is provided, the imaging medium having therein a plurality of fracturable layers, the plurality comprising a porous or particulate image-forming layer and a release layer, and at least one of the fracturable layers being deposited from a dispersion containing a hydrophobic cycloaliphatic polyepoxide. The laminar imaging medium is characterized by good imaging performance in an extended range of environmental conditions.

8 Claims, 1 Drawing Sheet

LAMINAR IMAGING MEDIUM UTILIZING HYDROPHOBIC CYCLOALIPHATIC POLYEPOXIDE IN THE FRACTURABLE LAYERS

FIELD OF THE INVENTION

Embodiments of the present invention are directed to a laminar imaging medium for the imagewise recordation of information, the recorded latent image being developable by laminar separation. More particular embodiments of the present invention are directed to a laminar imaging medium having at least one fracturable layer prepared from a dispersion containing a hydrophobic cycloaliphatic polyepoxide, the medium being characterized by broad environmental performance and good imaging performance.

BACKGROUND

Imaging media whereby a recorded latent image is developed by laminar separation are known. Among such imaging media, the provision of images which rely upon the generation of heat patterns is also known. Thermally imageable media are particularly advantageous inasmuch as they can be imaged without certain of the requirements attending the use of silver halide based media, such as darkroom processing and protection against ambient light. Moreover, the use of thermal imaging materials avoids the requirements of handling and disposing of silver-containing and other processing streams or effluent materials typically associated with the processing of silver halide based imaging materials.

Various methods and systems for preparing actinically generated symbols, patterns or other images have been reported, said methods and systems involving laminar separation to effect development. Examples of these can be found in U.S. Pat. No. 4,169,731 (issued Oct. 2, 1979 to Noshiro et al.); in U.S. Pat. No. 4,581,308 (issued Apr. 8, 1986 to Moriya et al.); in U.S. Pat. No. 4,271,255 (issued Jun. 2, 1981 to Cho et al.); in U.S. Pat. No. 4,511,641 (issued Apr. 6, 1985 to Busman et al.); in U.S. Pat. No. 4,963,462 (issued Oct. 16, 1990 to Wilczak et al.); in U.S. Pat. No. 4,356,251 (issued Oct. 26, 1982 to Cohen et al.); in U.S. Pat. No. 4,489,153 (issued Dec. 18, 1984 to Ashcraft et al.); in U.S. Pat. No. 4,489,154 (issued Dec. 18, 1984 to Taylor, Jr.); in U.S. Pat. No. 4,123,578 (issued Oct. 31, 1978 to K. J. Perrington, et al.); in U.S. Pat. No. 4,157,412 (issued Jun. 5, 1979 to K. S. Deneau); and in International Patent Application No. PCT/US87/03249 of M. R. Etzel (published Jun. 16, 1988, as International Publication Number WO 88/04237).

In the aforementioned International Patent Application No. PCT/US87/03249, there are described certain embodiments of a high resolution thermal imaging medium, which embodiments include a porous or particulate image-forming substance (e.g., a layer of pigment and binder) confined in a laminar structure between a pair of sheets. Upon laminar separation of the respective sheets, after laser exposure of portions or regions of the medium, a pair of complementary images is obtained. Among the laminar embodiments discussed in International Patent Application No. PCT/US87/03249 are those which include: a first sheet transparent to image-forming radiation and having at least a surface zone or layer of polymeric material which is heat-activatable upon subjection of the medium to brief and intense radiation; a layer of porous or particulate image-forming substance thereon; and a second sheet laminated and adhesively secured to the first sheet.

Upon exposure of regions or portions of the medium to brief and intense image-forming radiation, and conversion of absorbed energy to heat for activation of the heat-activatable polymeric material, corresponding regions or portions of the image-forming substance are caused to be more firmly attached or "locked" to the first sheet. Laminar separation of the sheet then effects fracturing of the image-forming layer in response to cohesive and/or adhesive failure. Abutting regions or portions of image-forming substance which are not subjected to such image-forming radiation are, upon separation of the first and second sheets, removed by the adhesive second sheet, for formation of an image complementary to the image on the first sheet.

The respective images obtained by separating the sheets of the exposed thermal imaging medium may exhibit substantially different characteristics. Apart from the imagewise complementary nature of these images and the relation that each may bear as a "positive" or "negative" of an original, the respective images may differ in character. Differences may depend upon the properties of the image-forming substance, on the presence of and nature of additional layer(s) in the medium, and upon the manner in which such layers fail adhesively or cohesively upon separation of the sheets. Either of the pair of images may, for reasons of informational content, aesthetics or otherwise, be desirably considered the principal image.

As described in the International Patent Application (and, e.g., U.S. Pats. Nos. 5,155,003 and 5,200,297), the image-forming layer may comprise image forming substances (e.g., carbon black particles) and a hydrophilic binder (e.g., polyvinyl alcohol). According to one practice, carbon black particles are initially suspended in an inert liquid vehicle (typically, water) and the resulting suspension or dispersion uniformly spread over an underlying layer.

In the aforementioned International Patent Application, mention is made of particular embodiments comprising a release layer overlying the image-forming layer. As disclosed, the fracturable release layer comprises a microcrystalline wax. Subsequent patents, e.g., U.S. Pat. No. 5,155,003, issued to K. C. Chang on Oct. 13, 1993, and U.S. Pat. No. 5,200,297, issued to N. F. Kelly on Apr. 6, 1993, suggest the additional incorporation into the release layer of particulate materials (such as silica, clay particles, and particles of polytetrafluoroethylene) and hydrophilic binding agents. Laminar separation of such medium will effect the fracturing of the image-forming layer and release layer in response to cohesive and/or adhesive failure, the failure being attributable to either of the two layers. It will be appreciated that, in general, adhesivity and cohesivity will oftentimes be affected by ambient environmental conditions.

While good results are obtained from the aforedescribed embodiments, a desire has developed to extend the performance of such media across a wider range of environmental conditions without departing from good imaging performance. Of particular interest is the realization of such performance under varying environmental conditions, for example, under tropical (i.e., hot and humid) and arid (i.e., hot and dry) conditions, these conditions being foreseeably encountered when such media are transported, stored, and/or used during imaging and development. Advantage may be derived from reduced implementation of environmentally-insulating packaging, transportation, and storage, as well as by ameliorating the affects on imaging of environmental conditions.

SUMMARY

While particularly well-suited for laminar imaging media, the subject matter described herein contemplates and enables control of, for example, the release strength and peel strength of laminar media. Particular laminar media contemplated are those wherein utility is related to the fracturing and separation of peel-separable, particulate containing layers, these layers being relatively hydrophilic and, accordingly, sensitive to ambient atmospheric moisture content (i.e., humidity).

Aside from its broader scope, in a primary application of the herein described subject matter, a peel-developable imaging medium for the imagewise recordation of information is provided, the imaging medium having therein a fracturable release layer and a fracturable porous or particulate image-forming layer; the image-forming layer being deposited from a formulation comprising an image-forming colorant and a hydrophilic binder; the release layer being deposited from a formulation comprising cohesivity-effecting particles and a hydrophilic binder; the release layer particle (and/or the image-forming colorant) of the release layer formulation having hygroscopic surface functionalities, such as Si-OH and Si-O$^-$ on silica-based particles (and —COO—NH$_4$$^+$, —COOH, —COO$^-$ on carbon black particles). Hydrophobic cycloaliphatic polyepoxide is added into the release layer formulation, and the release layer formulation then integrated into the peel-developable imaging medium. Due to the fugitive nature of the hydrophobic cycloaliphatic polyepoxides, some migration into the adjacent image-forming layer will typically occur. In an alternative embodiment, the hydrophobic cycloaliphatic polyepoxide is added into the image-forming layer formulation, and the image-forming layer formulation then integrated into the peel-developable imaging medium. As with the previous embodiment, migration of some polyepoxide (into an adjacent release layer) will typically occur.

Generally having detectable presence in both the release layer and the image-forming layer, the addition of hydrophobic cycloaliphatic polyepoxides will effect- among other measurable variables—moisture resistance, release strength, and peel strength. The laminar imaging medium is characterized by its enhanced environmental performance and good imaging performance. In certain thermally-imaged embodiments, enhanced burnout and sensitivity have also been observed.

In light of the above, it is an object of the present invention to provide a laminar imaging medium having good imaging performance under a comparatively broad range of environmental conditions.

It is a further object of the present invention to provide a thermal imaging medium with improved burnout and sensitivity performance.

It is a further object of the present invention to provide a laminar, peel-developable imaging medium having at least one fracturable layer, the fracturable layer prepared from a formulation into which a hydrophobic cycloaliphatic polyepoxide has been added.

It is a further object of the present invention to provide a laminar, peel-developable imaging medium having a particulate containing release layer and a porous or particulate image-forming layer, the release layer prepared from a formulation into which a hydrophobic cycloaliphatic polyepoxide has been added.

It is a further object of the present invention to provide a laminar, peel-developable imaging medium having a particulate containing release layer and a porous or particulate image-forming layer, the image forming layer prepared from a formulation into which a hydrophobic cycloaliphatic polyepoxide has been added.

It is a further object of the present invention to provide a laminar, peel-developable imaging medium having a particulate containing release layer and a porous or particulate image-forming layer, the laminar imaging medium having hydrophobic, cycloaliphatic polyepoxides associated with hygroscopic particles in the release layer and the image-forming layer.

It is a further object of the present invention to provide a laminar imaging medium for the imagewise recordation of information, the recorded latent image being developable by laminar separation, said laminar imaging medium comprising: first and second support sheets; an imagewise activatable polymeric layer, the imagewise activatable layer being activatable in response to an imagewise recordation to thereby change said layer's adhesivity to a porous or particulate image-forming layer; a plurality of fracturable layers, the plurality comprising the porous or particulate image-forming layer and a release layer, at least one of the fracturable layers being deposited from a dispersion containing a hydrophobic cycloaliphatic polyepoxide; the porous or particulate image-forming layer disposed on the imagewise activatable layer and forming an interface therewith, the image-forming layer having cohesivity in excess of its adhesivity for the imagewise activatable layer; a release layer disposed on the image-forming layer and forming an interface therewith such that upon laminar separation of the laminar imaging medium following activation of areas of the laminar imaging medium failure occurs in areas corresponding to the imagewise recordation within or at a surface of the release layer; and the first support sheet secured to the imagewise activatable layer and the second support sheet adhered to the face of the release layer remote from the imagewise activatable layer.

These and other objects of the invention, as well as details relating to the practice of several representative embodiments of the invention, will be better appreciated from the following description construed with consideration of the attached drawings.

DETAILED DESCRIPTION OF THE INVENTION

Figure 1:
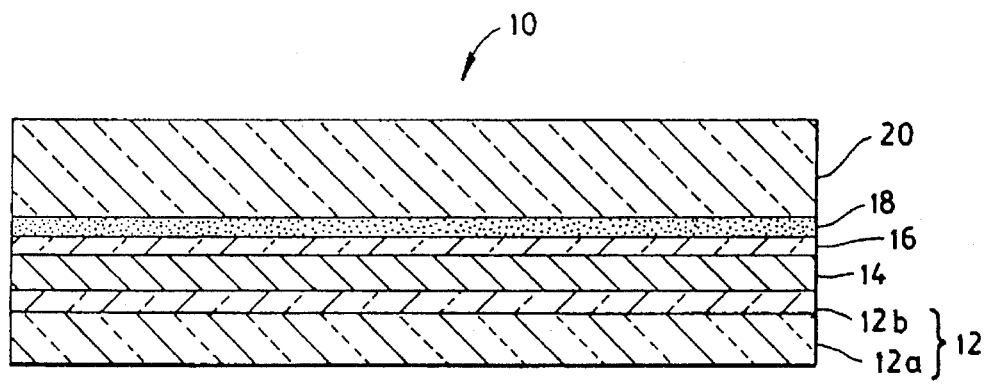
FIG. 1 is a schematic cross-sectional view of a laminar imaging medium according to an embodiment of the present invention.

Embodiments of the present invention are generally directed to a laminar imaging medium for the imagewise recordation of information, the recorded latent image being developable by laminar separation (i.e., peeling). Utility of the peel-developable imaging medium is effected by the provision therein of at least one fracturable (or "disruptible") layer, said fracturable layer breaking, failing, splitting, or otherwise undergoing like fracturing in response to peeling. In a particular embodiment, the peel-developable imaging medium is provided with a fracturable release layer and a fracturable porous or particulate image-forming layer; the image-forming layer comprising an image-forming colorant and a hydrophilic binder; the release layer comprising cohesivity-effecting particles and a hydrophilic binder; the release layer and the image-forming layer formulated from dispersions wherein the release layer particles and/or the image-forming colorant have hygroscopic surface functionalities, such as Si—OH and/or Si—O⁻ on silica-based particles, and —COO—$NH_4^+$, —COOH and/or —COO⁻ on carbon black particles.

In accord with an embodiment, a hydrophobic cycloaliphatic polyepoxide is added into the release layer formulation, the release layer formulation being then integrated into the peel-developable imaging medium to provide therein a fracturable release layer interfacially adjacent to a porous or particulate image forming layer. Due to the fugitive nature of the hydrophobic cycloaliphatic polyepoxide, migration of some epoxide into the adjacent image-forming layer will typically occur.

In an alternative embodiment, the hydrophobic cycloaliphatic polyepoxide is initially added into an image-forming layer formulation, the image-forming layer formulation being then integrated into the peel-developable imaging medium to provide therein a fracturable porous or particulate image forming layer interfacially adjacent to a release layer. As with the other embodiment, migration of some epoxide into the adjacent release layer will typically occur.

Consonant with the objectives of the present invention, the addition of highly reactive cycloaliphatic polyepoxide introduces (directly or indirectly) a hydrophobic component into the release layer and the image forming layer. The addition also effects the cohesion of and the adhesion between the release layer and the image forming layer, and thereby, effecting the peel strength and/or release strength associated with the development of the laminar imaging medium. The laminar imaging medium is characterized primarily by its enhanced environmental performance, the enhanced environmental performance being achieved without departing from good imaging performance. Certain embodiments are also characterized as having enhanced burnout and exposure-related sensitivity.

In general, the inventive aspects of the subject matter described herein subsist in the addition into a relatively hydrophilic particulate dispersion of a multifunctional hydrophobic cycloaliphatic epoxide (i.e., a hydrophobic cycloaliphatic polyepoxide). When the dispersion is integrated into a laminar imaging medium, for example, when a release layer formulation is coated and allowed to dry in a laminar imaging medium, the cycloaliphatic epoxides are believed to graft onto the hydrophilic functionalities on the surface of the release layer particle, effectively blocking said functionalities, and thereby effecting more balanced and stable release and peel strengths (cf., reduced moisture sensitivity) throughout a broad range of environmental conditions. The improved sensitivity and burnout ratio manifest in certain embodiments are believed to be resultant of greater interfacial adhesion effected between the release layer and the image forming layer.

The hydrophobic cycloaliphatic polyepoxides selected for use in the present invention are characterized by the existence of an epoxide group on a saturated ring structure. Illustrative of suitable cycloaliphatic polyepoxides are hydrophobic species represented by the following formula:

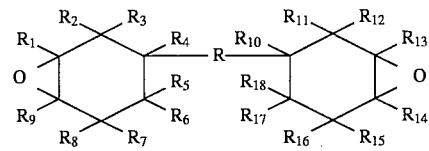

wherein $R_1$ through $R_{18}$, being the same or different, are monovalent substituents, such as hydrogen atoms, halogen atoms, or alkyl radicals generally containing one to nine carbon atoms inclusive, and preferably containing one to three carbon atoms, inclusive, as for example methyl, ethyl, n-propyl, n-butyl, n-hexyl, 2-ethylhexyl, n-octyl, n-nonyl, and the like, and wherein R is —COO—$CH_2$— or —$CH_2$O—CO—$R_{19}$—CO—OCH—, $R_{19}$ being a valence (single) bond or a divalent hydrocarbon radical generally containing one to twenty carbon atoms, inclusive, as for example, akylene radicals, such as trimethylene, tetramethylene, pentamethylene, hexamethylene, 2-ethylhexamethylene, octamethylene, nonamethylene, hexadecamethylene, and the like. Among specific cycloaliphatic polyepoxides within the scope of this formula are bis(3,4-epoxycyclohexylmethyl) oxalate; bis(3,4-epoxycyclohexylmethyl) adipate; bis(3,4-epoxy-6-methylcyclohexylmethyl) adipate; bis(3,4-epoxycyclohexylmethyl) pimelate; 3,4-epoxycyclohexylmethyl- 3,4-epoxycyclo hexanecarboxylate; 3,4-epoxy-1-methylcyclohexylmethyl- 3,4-epoxy-1-methylcyclohexanecarboxylate-6-methyl- 3,4-epoxycyclohexyl-methyl-6-methyl-3,4-epoxycyclohexane carboxylate; 3,4-epoxy-3-methylcyclohexylmethyl-3,4-epoxy-3-methylcyclohexanecarboxylate; 3,4-epoxy-5-methylcyclohexylmethyl-3,4-epoxy-5-methylcyclohexane carboxylate; and the like. Other suitable hydrophobic cycloaliphatic polyepoxides can be found discussed, for example, in U.S. Pats. Nos. 5,043,221, 2,750,395, 2,890,194, and 3,318,822.

Species of hydrophobic cycloaliphatic polyepoxides that are preferred for certain embodiments of the laminar medium described herein include bis-(3,4-epoxycyclohexyl)methyladipate) and 3,4-epoxycyclohexylmethyl-3,4-epoxycyclohexanecarboxylate. Bis (3,4-epoxycyclohexyl)methyladipate), is available from Union Carbide Chemicals & Plastic Technology Corporation under the registered tradename CYRACURE UVR-6128, product number ERL-4299, (solubility in water at 25° C. is 0.01% by wt.), and has the following molecular formula:

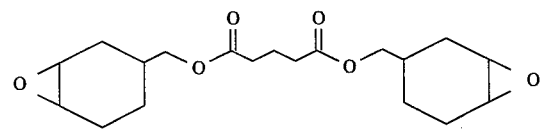

3,4-epoxycyclohexylmethyl-3,4-epoxycyclohexanecarboxylate, is available from Union Carbide Chemicals & Plastic Technology Corporation under the registered tradename CYRACURE UVR-6110, product number ERL-4221, (solubility in water at 25° C. is 0.03% by wt.), and has the following molecular formula:

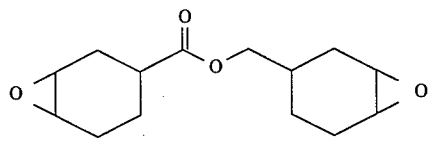

While the scope of the present invention expressly circumscribes the use of hydrophobic cycloaliphatic polyepoxides, it will be appreciated that hydrophobic polyepoxides such as

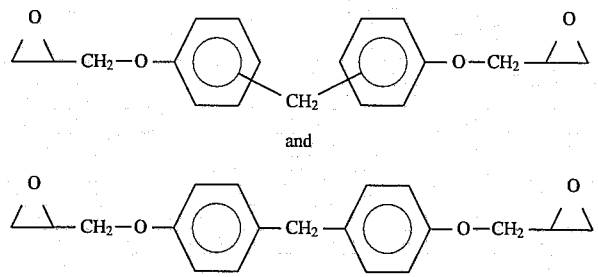

have been used in substitute for the hydrophobic cycloaliphatic polyepoxides selected for the present invention. However, such multifunctional hydrophobic epoxides are disfavored to the extent they possess less reactive epoxide functionalities and will accordingly undergo less grafting onto the hydroscopic surface functionalities of the release layer particle or image-forming layer colorant.

It will be appreciated that the teaching underlying the herein discussed embodiments may be incorporated into several other peel-developable imaging systems to produce a laminar imaging medium with the scope of the claimed invention. Examples of peel-developable imaging systems may be found discussed in U.S. Pat. No. 5,225,314, issued to Waterman, et al. on Jul. 6, 1993, U.S. Pat. No. 5,200,297, issued to N. F. Kelly on Apr. 6, 1993, U.S. Pat. No. 5,155,003, issued to K. C. Chang on Oct. 13, 1992, and U.S. Pat. No. 5,227,277, issued to Waterman on Jul. 13, 1993. Regardless, to facilitate presentation herein, reference will be made to the thermal imaging medium illustrated in the Figures. The description of this representative embodiment will enable one skilled in the art to make and use the other several embodiments contemplated.

Figure 2:
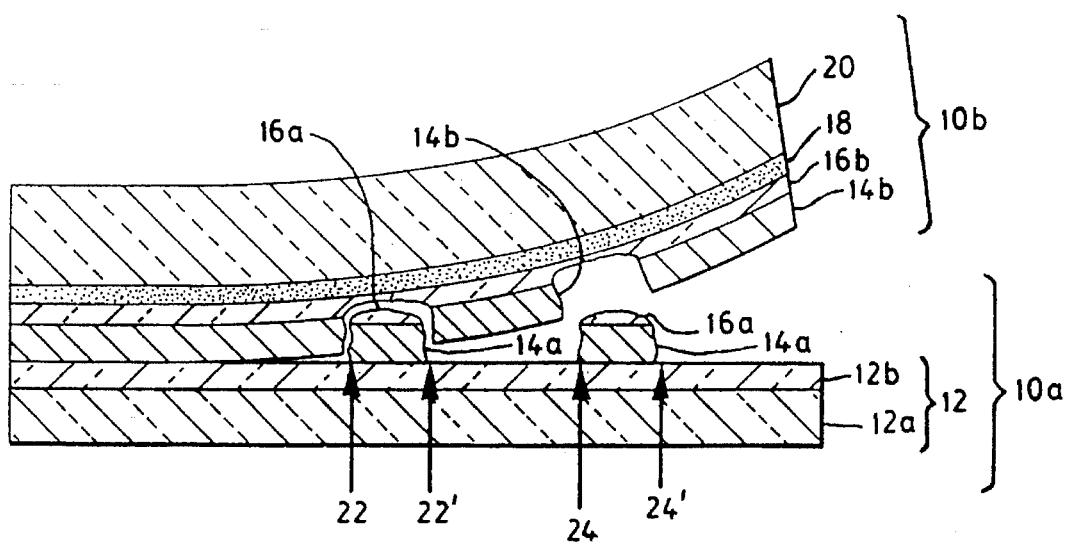
FIG. 2 is a schematic cross-sectional view of the laminar imaging medium illustrated in FIG. 1, the laminar imaging medium being shown in a state of partial laminar separation after imaging.

In FIG. 1, there is shown a laminar imaging medium (generally designated 10) of the present invention suited to production of a pair of high resolution images, shown in FIG. 2 as images 10a and 10b in a partial state of separation. As illustrated in FIG. 1, thermal imaging medium 10 includes a first element in the form of a first sheet-like or web material 12 (comprising sheet material 12a and heat-activatable zone or layer 12b) having superposed thereon, and in order, porous or particulate image-forming layer 14, release layer 16, adhesive layer 18, and second sheet-like or web material 20.

Upon exposure of the medium 10 to, for example, infrared radiation, exposed portions of image-forming layer 14 are more firmly attached to web material 12, so that, upon separation of the image-forming layer of the respective sheet-like materials, as shown in FIG. 2, a pair of images, 10a and 10b, is provided. The nature of certain layers of the layers of thermal imaging medium material 10 and their properties are importantly related to the manner in which the respective images are formed and partitioned from the medium after exposure. The various layers of medium material 10 are described in detail below, attention being initially directed to image-forming layer 14, release layer 16, and methods of introducing hydrophobic cycloaliphatic polyepoxides into such layers.

For the production of images of high resolution, it is important that image-forming layer 14 comprise materials that permit fracture through the thickness of the layer and along a direction substantially orthogonal to the interface between surface zone or layer 12b and image-forming layer 14, i.e., substantially along the direction of arrows 22, 22', 24, and 24', shown in FIG. 2. It will be appreciated that, in order for images 10a and 10b to be partitioned in the manner shown in FIG. 2, imaging-forming layer 14 will be orthogonally fracturable as aforedescribed and will have a degree of cohesivity in excess of its adhesivity for heat-activatable zone or layer 12b. Thus, on separation of webs 12 and 20 after imaging, layer 14 will separate in non-exposed areas from heat-activatable layer 12b and remain in exposed areas as porous or particulate portions 14a on sheet or web 12. Layer 14 is an imagewise disruptible layer owing to the porous or particulate nature thereof and the capacity for the layer to fracture or break sharply at particle interfaces.

The image-forming layer 14 according to the representative embodiment is deposited from a formulation comprising an image-forming colorant, a hydrophilic water-soluble binder, and the aforedescribed hydrophobic cycloaliphatic polyepoxide (or mixtures thereof). The image-forming layer formulation is then deposited onto heat-activatable layer 12b to form a porous or particulate layer or coating.

Layer 14, also referred to as colorant/binder layer, can utilize several colorant materials, the selected colorant being a pigment or dye or any desired color, and preferably, being substantially inert to the elevated temperatures required for thermal imaging of medium 10. Carbon black is a particularly advantageous and preferred pigment material. In accord with the present invention, the carbon black, when present in a formulation together with a hydrophilic binder, will be characterized by the presence of hydrophilic surface functionalities. Preferably, the carbon black material will comprise particles having an average diameter of about 0.01 to 10 micrometers (microns).

Aside from carbon black, other optically dense substances, such as graphite, phthalocyanine pigments and other colored pigments can be used. If desired, substances which change their optical density upon subjection to temperatures as herein described can also be considered. For particular embodiments employing these other pigments and substances, the hydrophobic cycloaliphatic polyepoxide should be selected in consideration of the character of the surface functionalities of such pigment or substance in a hydrophilic binder.

Suitable hydrophilic binder materials for image-forming layer 14, include gelatin, polyvinyl alcohol, hydroxyethyl cellulose, gum arabic, methyl cellulose, polyvinylpyrrolidone, polyethyloxazoline, polystyrene latex and poly(styrene-co-maleic anhydride). The ratio of pigment (e.g., carbon black) to binder can be in the range from 40:1 to about 1:2 on a weight basis. Preferably, the ratio of pigment to binder will be in the range of from about 4:1 to about 10:1. A preferred binder material for a carbon black pigment material is polyvinyl alcohol.

In embodiments of the present invention, release layer 16 is designed such that its cohesivity or its adhesion to either adhesive layer 18 or porous or particulate layer 14 is less, in exposed regions, than the adhesion of layer 14 to heat-activated zone or layer 12b. The result of these relationships is that release layer 16 undergoes an adhesive failure in exposed areas at the interface between layers 16 and 18, or at the interface between layers 14 and 16; or as shown in FIG. 2, a cohesive failure of layer 16 occurs, such that portions (16b) are present in image 10b and portions (16a) are adhered in exposed regions to porous or particulate layer 14a. Portions 16a of release layer 16 serve to provide surface protection for the image areas of image 10a, against abrasion or wear.

Release layer 16 can comprise wax, wax-like, or resinous material. Microcrystalline waxes, for example, high density polyethylene waxes available as aqueous dispersions, can be used for this purpose. Other suitable materials include carnauba, beeswax, paraffin wax, and wax like materials such as poly(vinylstearate), polyethylene sebacate, sucrose polyesters, polyalkylene oxides and dimethylglycol phthalate. Polymeric or resinous materials such as poly(methylmethacrylate) and copolymers of methyl methacrylate and monomers copolymerizable therewith can be employed.

In accord with the representative embodiment of the present invention, hydrophilic colloid materials, such as polyvinylalcohol, gelatin, or hydroxyethyl cellulose are included in the release layer 16 as polymeric binding agents. Resinous materials, typically coated as latices, can be used and latices of poly(methyl methacrylate) are especially useful. In the embodiment, cohesivity of release layer 16 is controlled to provide the desired and predetermined fractioning. Such control is effected by the addition of particulate materials, whereby the waxy or resinous release layer 16 is disruptible and can be fractured sharply at the interfaces of particles. Examples of such particulate materials include, silica, clay particles, and particles of poly(tetrafluoroethylene). In respect of the character of the selected particulate material in said embodiment and its surrounding matrix, e.g., polyvinylalcohol binder, interfacial interaction of one with the other imparts onto the particulate materials hygroscopic surface functionalities. While the underlying theory is not intended to limit the scope of the claimed invention, as suggested above, sensitivity of a laminar medium to ambient moisture content is believed to be tied to presence of such hygroscopic surface functionalities.

In embodiments of the laminar imaging medium disclosed herein, the release layer and/or the image-forming layer are both coated from water-borne particulate-containing dispersions, such dispersions exhibiting comparatively hydrophilic properties. It will be appreciated that the incorporation of a hydrophobic material (cycloaliphatic polyepoxide) in a hydrophilic particulate dispersion may present a problem of incompatibility. Regardless, as illustrated herein, the water-insoluble cycloaliphatic polyepoxides can be stably integrated into said particulate dispersions.

By one embodiment of the method, a water-borne particle dispersion is prepared, the dispersion being aqueous and comprising hygroscopic particles (e.g., carbon black, silica, and other like microgranules), water-soluble resins (e.g., polyvinylalcohol), and water-insoluble cycloaliphatic polyepoxide. Such dispersion is prepared by first charging the water-insoluble cycloaliphatic polyepoxide into an aqueous dispersion containing the water-borne particles. The formulation is then vigorously agitated to facilitate interaction between the hygroscopic particles and the cycloaliphatic polyepoxide. Mechanical stirring is preferred for mixing the materials, followed by further treatment in a sonicator or microfluidizer. In the process, water-soluble resin may be added into the dispersion before or after charging with the water-insoluble cycloaliphatic polyepoxide. In any event, no significant phase separation was observed in formulations prepared in this manner, even after several days.

In another embodiment of the method, the dispersion is prepared by charging a water-insoluble cycloaliphatic polyepoxide/isopropanol solution (1:10 by weight) into an aqueous dispersion containing the water-borne particles and stirred. As with the above described embodiment, no significant phase separation was observed. In this embodiment, isopropanol is believed to act as a surfactant, facilitating the dispersion of the water-insoluble cycloaliphatic polyepoxide, and thereby improving adsorption onto the particle surface. In addition to isopropanol, other alcohols, such as ethanol and methanol, and other cosolvents and surfactants, such as methoxyethanol, can be utilized to achieve a similar effect.

While the scope of the method should not be limited by any theory, it is believed that the otherwise water-incompatible cycloaliphatic polyepoxide becomes adsorbed onto the dispersed particles, and thereby stably integrated into the aqueous formulation. Adsorbed onto the surface, the highly reactive cycloaliphatic polyepoxides are believed to graft onto the hygroscopic surface functionalities of the particle, as well as effect crosslinking between the particle phase and the polymeric binder.

It will be appreciated that in the preparation of a particulate dispersion, cycloaliphatic polyepoxide will oftentimes be added in amounts exceeding that which will react with the hygroscopic particles. It will be appreciated that some polyepoxide, once adsorbed onto a particle surface, may also by forces of equilibrium tend to dissociate from the particle. During the coating of the dispersions and subsequent formation of dry films, some of the unreacted or dissociated hydrophobic cycloaliphatic polyepoxide will react with the polymeric binder and effect crosslinking. Further, depending upon the particular cycloaliphatic polyepoxide, and especially on the nature of the material as a fugitive species, the polyepoxide will typically migrate to adjacent layers. Accordingly, in assembling a laminar imaging medium, the hereindescribed functionality provided by the cycloaliphatic polyepoxide can be effected, for example, in both the release layer and the image-forming layer, regardless of which layer was coated from a polyepoxide-modified particulate formulation. While the degree and nature of functionality can vary, the presence and effect of cycloaliphatic polyepoxide will typically be detectable in both layers.

For embodiments of the thermal imaging medium discussed herein, hydrophobic cycloaliphatic polyepoxide is added at an approximate ratio of approximately 100 to approximately 2,000 molecules per carbon black (approximately 700 molecules suggested) or at an approximate ratio of approximately 100 to approximately 2,000 molecules per release particle (approximately 300 molecules suggested). It will be appreciated that these ratios are not critical to the practice of the present invention. The ratios are subject to modification based on such factors as desired use and character of the laminar medium, and the size and character of the particles of the pertinent fracturable layers.

In the representative embodiment, the web material of layers 12a and 20 comprises a transparent material through which imaging medium 10 can be exposed to radiation. Web material can comprise any of a variety of sheet-like materials, although polymeric sheet materials will be especially preferred. Among preferred sheet materials are polystyrene, poly(ethylene terephthalate), polyethylene, polypropylene, poly(vinyl chloride), polycarbonate, poly(vinylidene chloride), cellulose acetate, cellulose acetate butyrate, and copolymeric materials such as the copolymers of styrene, butadiene, and acrylonitrile, including poly(styrene-co-acrylonitrile). An especially preferred sheet material from the standpoints of durability, dimensional stability, and handling characteristics is poly(ethylene terephthalate), commercially available, for example under the tradename Mylar, of E.I. du Pont de Nemours & Co., Wilmington, Del., or under the tradename Kodel, of Eastman Kodak Company, Rochester, N.Y.

In certain embodiments, a stress-absorbing layer (not shown) may be provided as described in U.S. Pat. No. 5,200,297, issued to N. F. Kelly on Apr. 6, 1993. Briefly, the stress-absorbing layer comprises a polymeric layer capable of absorbing physical stresses applied to the imaging medium 10. The stress-absorbing layer provides added protection against delamination of the medium 10 when rigorous physical stresses are applied thereto, and is desirably formed from a compressible or elongatable polyurethane. The stress-absorbing layer is optional and may sometimes be omitted, depending upon the stresses to which the medium 10 will be subjected.

Heat activatable zone or layer 12b provides an essential function in the imaging medium 10 and comprises a polymeric material which is heat activatable upon subjection of the medium 10 to brief and intense radiation, so that, upon rapid cooling, exposed portions of the surface zone or layer 12b are firmly attached to porous or particulate image-forming layer 14. If desired, as shown in FIGS. 1 and 2, heat-activatable zone or layer 12b can be a surface portion or region of web material 12, in which case, sheet material 12a and heat activatable zone or layer 12b will be of the same or similar chemical composition. In general, it is preferred that heat activatable zone or layer 12b desirably comprise a discrete polymeric surface layer on sheet material 12a or the aforementioned stress-absorbing layer. Layer 12 desirably comprises a polymeric material having a softening temperature lower than that of sheet material 12a, so that exposed portions of image-forming layer 14 can be firmly attached to web material 12. A variety of polymeric materials can be used for this purpose, including polystyrene, poly(styrene-co-acrylonitrile), poly(vinyl butyrate), poly(methyl methacrylate), polyethylene, and poly(vinyl chloride).

The employment of a heat activatable layer 12b on a substantially thicker and durable sheet material 12a permits desired handling of the web material and desired imaging efficiency. The use of a thin heat-activatable layer 12b facilitates the concentration of heat energy at or near the interface between heat-activatable layer 12b and image-forming layer 14 and permits optimal imaging effects and reduced energy requirements. It will be appreciated that the sensitivity of heat-activatable layer 12b to heat activation (or softening) and attachment or adhesion to image-forming layer 14 will depend upon the nature and thermal characteristics of heat activatable layer 12b and upon the thickness thereof.

As can be seen from FIG. 2, the relationship of adhesivity and cohesivity among the several layers of imaging medium 10 are such that separation occurs between layer 14 and heat-activatable zone or layer 12b in non-exposed regions. Thus, imaging medium 10, if it were to be separated without exposure, would separate between heat-activatable zone or layer 12b and layer 14 to provide a $D_{max}$ on sheet 20. The nature of image-forming layer 14 is such, however, that its relatively weak adhesion to heat-activatable zone or layer 12b can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 14, as portions 14a, to heat-activatable zone or layer 12b.

Attachment of weakly adherent image-forming layer 14 to heat-activatable zone or layer 12b in areas of exposure is accomplished by absorption of radiation within the imaging medium and conversion to heat sufficient in intensity to heat activate zone or layer 12b and on cooling to more firmly join exposed regions or portions of layer 14 to heat-activatable zone or layer 12b. Thermal imaging medium 10 is capable of absorbing radiation at or near the interface of heat-activatable zone or layer 12b. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

Inasmuch as a secure bonding or joining is desired at the interface of layer 14 and heat-activatable zone or layer 12b, it may be preferred in some instances that a light-absorbing substance be incorporated into either or both of image-forming layer 14 (in addition to the image-forming colorant) and heat-activatable zone or layer 12b.

Suitable light-absorbing substances in layer 12b (and/or layer 14), for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing absorbing dyes for this purpose include the alkylpyrylium-squarylium dyes, disclosed in U.S. Pat. No. 4,508,811 (issued Apr. 2, 1985 to D. J. Gravesteijn, et al.), and including 1,3-bis[2,6-di-t-butyl-4H-thiopyran-4-ylidene)methyl]-2, 4-dihydroxy-dihydroxide-cyclobutene diylium-bis{inner salt}. Other suitable IR-absorbing dyes include 4-[7-(4H-pyran-4-ylide)hepta- 1,3, 5-trienyl]pyrylium tetraphenylborate and 4-[[3-[7-diethylamino-2-(1,1-dimethylethyl)-benz[ b]-4H-pyran-4-ylidene)methyl]-2-hydroxy-4-oxo-2-cyclobuten- 1-ylidene] methyl]-7-diethylamino-2-(1,1-dimethylethyl)benz[b] pyrylium hydroxide inner salt. These and other IR-absorbing dyes are disclosed, for example, in U.S. Pat. No. 5,227,499, issued to McGowen et al. on Jul. 13, 1993; and U.S. Pat. No. 5,262,549, issued to Telfer et al. on Nov. 16, 1993.

For certain embodiments of the present invention, the aforementioned stress-absorbing layer can be provided on sheet material 12a by the methods described in the aforementioned U.S. Pat. No. 5,200,297. Heat-activatable layer 12b can be provided by resort to known coating methods. For example, a layer of poly(styrene-co-acrylonitrile) can be applied to a web of poly(ethylene terephthalate) by coating from an organic solvent such as methylene chloride. In general, the desired handling properties of web material 12 will be influenced by the nature of sheet material 12a itself, inasmuch as heat-activatable layer 12b (and stress-absorbing layer) will be coated thereon as thin layers. The thickness of web material 12 will depend upon the desired handling characteristics of medium 10 during manufacture and during imaging and post-imaging steps. Thickness will also be dictated in part by the intended use of the image to be carried thereon and by exposure conditions, such as the wavelength and power of the exposing sources. Typically, web material 12 will vary in thickness from about 0.5 to 7 mil (about 13 to 178 μm). Good results are obtained using, for example, a sheet material 12a having a thickness of about 1.5 to 1.75 mils (38 to 40 μm). Stress-absorbing layer will typically have a thickness in the range of about 1 to 4 μm, while heat-activatable layer 12b will typically be a layer of poly-(styrene-co-acrylonitrile) having a thickness of about 0.1 to 5 μm.

Heat-activatable layer 12b can include additives or agents providing known beneficial properties. Adhesiveness-imparting agents, plasticizers, adhesion-reducing agents, or other agents can be used. Such agents can be used, for example, to control adhesion between heat-activatable layer 12b and image-forming layer 14, so that undesired separation at the interface thereof is minimized during manufacture of laminar medium 10 or during use thereof in a thermal imaging method or apparatus. Such control also permits the medium, after imaging and separation of sheet like web materials 12 and 20, to be partitioned in the manner shown in FIG. 2.

Thermal imaging medium 10 can be imaged by creating (in medium 10) a thermal pattern according to the information imaged. Exposure sources capable of providing radiation can be imaged onto medium 10, and which can be converted by absorption into a predetermined pattern, can be used. Gas discharge lamps, xenon lamps and lasers are examples of such sources.

As shown in FIGS. 1 and 2, web 20 is provided with an adhesive layer 18, the adhesive layer being utilized to facilitate lamination during manufacture of medium 10. Typically, during manufacture, web 20 carrying adhesive layer 18 will be laminated to the balance of medium 10 carried on web 12 using pressure (or heat and pressure) to provide a unitary lamination. Adhesives of the pressure-sensitive and heat-activatable types can be used for this purpose. Suitable adhesives include poly(ethylene-co-vinyl acetate), poly(vinyl acetate), poly(ethylene-co-ethylacrylate), poly(ethylenecomethacrylic acid), and polyesters of aliphatic or aromatic dicarboxylic acids (or their lower alkyl esters) with polyols such as ethylene glycol, and mixtures of such adhesives.

The properties of adhesive layer 18 can vary in softness or hardness to suit particular requirements of the laminar medium during manufacture and use and image durability. An adhesive layer 18 of suitable thickness and softness to provide the capability of absorbing stresses that may cause an undesired delamination can be used and can, thus, serve as the stress-absorbing layer of medium 10.

If desired, a hardenable adhesive layer can be used and cutting or other manufacturing operations can be performed prior to the hardening of the layer, as described in International Patent Application No. PCT/US91/08585 of Neal F. Kelly, et at. (published as International Publication No. WO 92/09441).

The exposure of medium 10 to radiation can be progressive or intermittent. For example, a two-sheet laminar medium, as shown in FIG. 1, can be fastened onto a rotating drum for exposure of the medium through web material 12. A light spot of high intensity, such as is emitted by a laser can be used to expose the medium 10 in the direction of rotation of the drum, while the laser is moved slowly in the a transverse direction across the web, thereby to trace out a helical path. Laser drivers, designed to fire corresponding lasers, can be used to intermittently fire one or more lasers in a predetermined manner to thereby record information according to an original to be imaged. As shown in FIG. 1, a pattern of intense radiation can be directed onto medium 10 by exposure to a laser from the direction of the arrows 22 and 22' and 24 and 24', the areas between the respective pair of arrows defining regions of exposure.

If desired, a thermal imaging laminar medium of the invention, can be imaged using a moving slit or stencils or masks, and by using a tube or other source which emits radiation continuously and which can be directed progressively or intermittently onto medium 10. Thermographic copying methods can be used, if desired.

Preferably, a laser or combination of lasers is used to scan the medium and record information as very fine dots or pels.

Semiconductor diode lasers and YAG lasers having power output sufficient to stay within upper and lower exposure outputs in the range of from about 40 to about 1000 miliwatts. An exposure threshold value, as used herein, refers to a minimal power required to effect an exposure, while a maximum power output refers to a power level tolerable by the medium before "bum out" occurs. Lasers are particularly preferred as exposing sources since medium 10 may be regarded as a threshold-type of film; i.e., it possesses high contrast and, if exposed beyond a certain threshold value, will yield maximum density, whereas no density will be recorded below the threshold value. Especially preferred are lasers which can provide a beam sufficiently fine to provide images having resolution as fine 1,000 (e.g., 4,000 to 10,000) dots per centimeter.

Locally applied heat, developed at or near the interface of layer 14 and surface zone or layer 12b can be intense (about 400° C.) and serves to effect imaging in the manner described above. Typically, the heat will be applied for an extremely short period, preferably of the order of <0.5 microseconds, and exposure time span may be less than one millisecond. For instance, the exposure time span can be less than one millisecond and the temperature span in exposed regions can be between about 100° C. and about 1000° C.

If desired, further protection for the image 10b against abrasion and added durability can be achieved by including an additional layer (not shown) of a thermoplastic material intermediate image-forming layer 14 and surface zone or layer 12b, which additional layer comprises a polymeric disruptible layer fracturable substantially along the exposure direction and which provides surface protective portions (over image portions 14b) for improved durability of image 10b. A laminar thermal imaging medium including a thermoplastic intermediate layer to provide surface protection of an image prepared therefrom is disclosed and claimed in U.S. Pat. No. 5,155,003, issued to K. C. Chang on Oct. 13, 1992.

Alternatively, additional durability can be provided to image 10b by depositing a protective polymeric overcoat layer thereon. A protected image and method therefor are disclosed and claimed in International Patent Application PCT/US91/08345 of A. F. Fehervari et al. (published on Jun. 11, 1992 as WO 92/09930). A protected reflection image and method therefor are disclosed and claimed in U.S. patent application Ser. No. 08/236,491, filed by J. N. Gordon and G. Teng on Apr. 29, 1994.

The present invention will now be further illustrated with reference to examples. The following examples are presented for purposes of illustrating the invention but are not to be taken as limiting the invention.

EXAMPLES

Examples 1 to 2

Onto a first sheet of polyethylene terephthalate of 1.75-mil (0.044 mm) thickness was coated with the following layers in succession: a 0.7-micron thick stress-absorbing layer of polyurethane (Neorez R-972 from ICI Resins US, Wilmington, Mass.) and ammonium perfluoroalkyl sulfonate surfactant (Fluorad FC-120, 3M Company), at a weight ratio of 72.1/0.15; a one-micron thick heat sensitive layer of poly(styrene-co-acrylonitrile).

Five one-micron thick carbon black pigmented layers were made according to the formulations set forth in the following table.

TABLE A

Carbon Black Formulations

| COMPONENT | Control A | Example 1 | Example 2 | Ref. Example A-1 | Ref. Example A-2 |
|---|---|---|---|---|---|
| Aqueous Carbon Black Dispersion (50%) | 10.2 g | 10.2 g | 10.2 g | 10.2 g | 10.2 g |
| Polyvinyl Alcohol (Airvol 165 from Air Products; 4%) | 20.1 g | 20.1 g | 20.1 g | 20.1 g | 20.1 g |
| 5% Aqueous Boric Acid Solution | 1.43 g | 1.43 g | 1.43 g | 1.43 g | 1.43 g |
| Fluorinated Surfactant (Fluorad FC-120; 25%) | 0.02 g | 0.02 g | 0.02 g | 0.02 g | 0.02 g |
| Fluorinated Surfactant (Fluorad FC-171; 100%) | 0.01 g | 0.01 g | 0.01 g | 0.01 g | 0.01 g |
| Cyracure UVR-6128 from Union Carbide* in 10% Isopropanol | — | 1.46 g | — | — | — |
| Cyracure UVR-6128 from Union Carbide* | — | — | 1.46 g | — | — |
| Araldite RD-2 from Ciba-Geigy** in 10% Isopropanol | — | — | — | 1.46 g | — |
| Araldite RD-2 from Ciba-Geigy** | — | — | — | — | 1.46 g |
| Deionized Water | 66.7 g | 66.7 g | 66.7 g | 66.7 g | 66.7 g |

*bis-(3,4-epoxycyclohexylmethyl) adipate
**1,4-butanediol diglycidyl ether (BDDE)

Preparation of Control Sample

(Carbon Black Fluid without Epoxide)

A carbon black aqueous dispersion (10.2 g, 49.8% solids) is mixed with 66.7 g of deionized water with stirring, followed by addition of 20.1 g of polyvinylalcohol (Airvol 165 from Air Products) aqueous solution (4% solids), 1.43 g of boric acid aqueous solution (5%), fluorinated surfactant (0.02 g of Fluorad FC-120 (25%), and 0.01 g of Fluorad FC-171 (100%), both from 3M). The fluid is sonified for about 10 to 30 minutes.

Preparation of Reference Examples A-1 and A-2

(Carbon Black with 1,4-butanediol diglycidyl ether (BDDE))

Reference Example A-1 was prepared by gradually adding (with stirring) 1.46 g of 1,4-butanediol diglycidal ether (Araldite RD-2 from Ciba-Geigy) in 10% isopropanol solution into the above Control Carbon Black Fluid (98.5 g). Reference Example A-2 was prepared by gradually adding (with stirring) 1.46 g of 1,4-butanediol diglycidal ether (Araldite RD-2 from Ciba-Geigy) into the above Control Carbon Black Fluid (98.5 g).

Preparation of Examples 1 and 2

(Carbon Black with bis-(3,4-epoxycyclohexylmethyl) adipate)

A first carbon black formulation (Example 1) with water-insoluble cycloaliphatic epoxide in isopropanol is prepared as follows: Into the above Control Carbon Black Fluid (98.5 g), 1.46 g bis-(3,4-epoxycyclohexylmethyl) adipate (Cyracure UVR-6128 from Union Carbide) in isopropanol solution (10%) is added slowly and continuously stirred until the epoxide is incorporated (i.e., no longer seen). No phase separated epoxide should be observed.

A second carbon black formulation (Example 2) with water-insoluble cycloaliphatic epoxide is prepared as follows: Into the above Control Carbon Black Fluid (98.5 g), 1.46 g bis-(3,4-epoxycyclohexylmethyl) adipate (Cyracure UVR-6128 from Union Carbide) is added slowly and continuously stirred until the epoxide is incorporated (i.e., no longer seen). No phase separated epoxide should be observed.

Each of the above carbon black formulations are then coated onto first polyethylene terephthalate support and followed by the coating of the following layers:

a 900 μm thick release layer consisting of styrenated acrylate latex particles (Joncryl 87, Johnson Wax Company, Racine, Wis.), silica (Nyacol 1430 LS, Nyacol Products Inc., Ashland, Mass.), polyvinylalcohol (Airvol 165 from Air Products, Allentown, Pa.), boric acid, siloxane surfactant Silwet L-7607 and Silwet L-7605 (Union Carbide, Danbury, Conn.), at solid weight ratios, respectively, of 1/1.4/0.1/0.0009/0.0155/0.0055; and a 3.6 μm thick layer comprising a terpolymer of vinylidene chloride, acrylic acid, and acrylonitrile (Daran SL-158 aqueous emulsion from W. R. Grace Company), and ammonium perfluoroalkyl surfactant (FC-120 from Minnesota Mining and Manufacturing Company), at a solid weight ratio of 580/1.

Onto a second sheet of polyethylene terephthalate of 7-mil (0.178 mm) thickness is coated with a layer of UV-curable adhesive comprising trimethylolpropane triacrylate monomer (TMPTA, Sartomer 351, Sartomer Company, West Chester, Pa.), poly(butyl methacrylate-co-butyl acrylate), p-methoxyphenol, 2,2-dimethoxy-2-phenylacetophenone (Irgacure 651, Ciba Geigy Corporation), tetrakis [methylene(3,5-di-tert-butyl-4-hydroxyhydrocinnamate)] methane (Irganox 1010, Ciba Geigy Corporation), and thiodiethylene bis(3,5-di-tert-butyl-4-hydroxyl) hydrocinnamate (Irganox 1035, Ciba Geigy Corporation), at solid weight ratios of 24.78/90.72/0.03/8.69/0.28/0.28, respectively.

The first and second polyethylene terephthalate sheets are laminated together coating sides inwards. The laminated film is irradiated with UV light to cure the UV adhesive. The cured media is cut into 8×10 inch sheets for imaging evaluation.

Evaluations

Imaging Tests: The cured film is imaged by laser exposure (through the 1.75-mil polyethylene terephthalate sheet) using a high intensity semiconductor laser. The film is fixed (clamped) to a rotary drum with the 7-mil polyethylene terephthalate base facing the drum. The radiation of semiconductor lasers is directed to the rotating drum with the laser source moving parallel to the drum axial direction at certain speeds. The semiconductor lasers are individually turned on and off in response to the digital representation of the original image. The laser-imaged film is taken off the drum and peeled apart to obtain a first image on the 1.75-mil polyethylene terephthalate sheet and a complementary, second image on the second 7-mil polyethylene terephthalate sheet. In the process, both Peel Force (g/in) and Release Strength (g/in) are measured.

Sensitivity and Burn Out Tests: A procedure similar to the above Imaging Test is used for testing sensitivity and burnout except that the drum was programmed to rotate at different speeds, while the laser intensity and the image pattern are maintained. The laser power thus applied to the film effects imaging disproportional to the drum speed. The highest speed at which the film shows any image pattern is defined as sensitivity (m/sec), and the lowest speed at which the film shows any burn-through in the release layer or carbon black layer is defined as burn-out.

The results of the above two tests are presented in the following Table AA.

burn-out, and higher burn-out ratios over films without diepoxide. Media based on carbon black fluids made with the addition of water-soluble diepoxide in ispropanol showed sensitivity, burn-out, and burn-out ratios generally the same as the control. All media showed good imaging at room temperature.

Examples 3 to 4

A first sheet of polyethylene terephthalate of 1.75-mil (0.044 mm thickness) is coated with the following layers in succession: a 0.7-micron thick stress-absorbing layer of Neorez R-9619 polyurethane (from ICI Resins US, Wilmington, Mass), Neorez R-9637 polyurethane (from ICI Resins US), and ammonium perfluoroalkyl sulfonate surfactant (Fluorad FC-120, 3M Company), at a solid weight ratio of 58.6/6.51/0.14; and a one-micron thick heat sensitive layer of poly(styrene-co-acrylonitrile);

Five one μm thick carbon black pigmented layers are coated from the formulations set forth in the following Table B.

TABLE AA

Imaging Performance Evaluations

| EVALUATION | Control A | Example 1 | Example 1'* | Example 2 | Ref. Sample A-1'* | Ref. Sample A-1 | Ref. Sample A-1"* | Ref. Sample A-2 |
|---|---|---|---|---|---|---|---|---|
| Diepoxide Level (PVA = 1) | 0 | 0.18 | 0.09 | 0.18 | 0.09 | 0.18 | 0.27 | 0.18 |
| Relative Sensitivity with 0.36th Filter (m/s) | 10.00 | 10.80 | 10.90 | 10.00 | 10.15 | 10.00 | 10.00 | 10.00 |
| Relative Burn-Out (m/s) | 6.05 | 5.30 | 5.15 | 6.05 | 6.10 | 5.85 | 5.95 | 6.00 |
| Burn-Out Ratio | 3.79 | 4.67 | 4.85 | 3.79 | 3.81 | 3.91 | 3.85 | 3.82 |
| Peel Force (g/in) | 3.2 | 3.6 | 3.3 | 3.1 | 2.9 | 3.0 | 3.1 | 3.2 |
| Release Strength (g/in) | 14.9 | 13.9 | 12.2 | 14.6 | 14.1 | 13.6 | 14.3 | 14.4 |

*Example 1', and Reference Examples A-1' and A-1" differ from their pertinent counterparts only on the basis of diepoxide levels.

In summary, the media based on carbon black fluid with addition of water-insoluble cycloaliphatic epoxide and isopropanol as a dispersant shows higher sensitivity, reduced

TABLE B

Carbon Black Formulations

| COMPONENT | Control B | Example 3 | Example 4 | Ref. Example B-1 | Ref. Example B-2 |
|---|---|---|---|---|---|
| Aqueous Carbon Black Dispersion (50%) | 10.3 g | 10.3 g | 10.3 g | 10.3 g | 10.3 g |
| Polyvinyl Alcohol (Vinol | 11.7 g | 11.7 g | 11.7 g | 11.7 g | 11.7 g |

TABLE B-continued

| | Carbon Black Formulations | | | | |
|---|---|---|---|---|---|
| COMPONENT | Control B | Example 3 | Example 4 | Ref. Example B-1 | Ref. Example B-2 |
| 540 from Air Products; 7%) | | | | | |
| Fluorinated Surfactant (Fluorad FC-120; 25%) | 0.01 g | 0.01 g | 0.01 g | 0.01 g | 0.01 g |
| Cyrocure UVR-6110 from Union Carbide* in 10% Isopropanol | — | 1.48 g | | | |
| Cyracure UVR-6110 from Union Carbide* | — | — | 1.86 g | — | — |
| Araldite RD-2 from Ciba-Geigy** in 10% Isopropanol | — | — | — | 1.48 g | — |
| Araldite RD-2 from Ciba-Geigy** | — | — | — | — | 1.48 g |
| Deionized Water | 76.5 g | 76.5 g | 76.5 g | 76.5 g | 76.5 g |

*3,4-epoxycyclohexylmethyl-3,4-epoxycyclohexane carboxylate
**1,4-butanediol diglycidyl ether Over the carbon black layer is deposited a 900 μm thick release layer consisting of styrenated acrylate latex particles (Joncryl 87, Johnson Wax Company, Racine, Wis.), silica (Nyacol 1430 LS, Nyacol Products Inc., Ashland, Mass.), polyvinylalcohol (Vinol 540 from Air Products, Allentown, Pa.), Gantrez S97 (GAF Chemicals Corporation, Wayne, N.J.), siloxane surfactant Silwet L-7607 and Silwet L-7605 (Union Carbide, Danbury, Conn.) at a solid weight ratio of 1/1.4/0.1/0.02/0.013/0.004.

Over the release layer is deposited a 3.6 μm thick adhesive layer comprising a terpolymer of vinylidene chloride, acrylic acid, and acrylonitrile (Daran SL-159 aqueous emulsion from the W. R. Grace Company), Michelube 160 (Michelman Inc., Cincinnati, Ohio), Dowfax 3B2 (Dow Chemical Co., Midland, Mich.), and ammonium perfluoroalkyl sulfonate surfactant (FC-120, Minnesota Mining and Manufacturing Company) at a solid weight ratio of 340.3/1.7/0.86/0.25.

Onto a 7-mil (0.178 mm) thick second sheet of polyethylene terephthalate is coated a layer of UV-curable adhesive comprising trimethylolpropane triacrylate monomer (TMPTA, Sartomer 351, Sartomer Company, West Chester, Pa.), acrylic copolymer Elvacite 2045 (duPont Company, Wilmington, Del.), polymer Doresco RAC-102-19 (Dock Resins Corporation, Linden, N.J.), p-methoxyphenol, 2,2-dimethoxy-2-phenylacetophenone (Irgacure 651, Ciba-Geigy Corporation), tetrakis {methylene (3,5-di-tert-butyl-4-hydroxyhydrocinnamate)} methane (Irganox 1010, Ciba-Geigy Corporation), thiodiethylene bis(3,5-di-tert-butyl-4-hydroxyl)hydrocinnamate (Irganox 1035, Ciba-Geigy Corporation), at solid weight ratios of 304.1/217.25/391.40/0.43/60.83/1.52/1.52, respectively.

The first and second coated polyethylene terephthalate sheets are laminated together coating sides inwards. The laminated film is immediately cured by UV irradiation. The cured film is formatted, then imaged and evaluated by the processes described for Examples 1 and 2, supra. The cured film is also evaluated for environmental performance in Hot/Dry, Hot/Wet, and Room Temperature conditions.

The test results are shown below in the following Table BB:

TABLE BB

| | Environmental and Imaging Performance Evaluations | | | | | | | |
|---|---|---|---|---|---|---|---|---|
| EVALUATION | Control B | Example 3'* | Example 3''* | Example 3 | Example 3'''* | Example 4 | Ref. Sample B-1 | Ref. Sample B-2 |
| Diepoxide Level (PVA = 1) | 0 | 0.1 | 0.14 | 0.18 | 0.22 | 0.18 | 0.18 | 0.18 |
| "Pepper": Room Temp. | 8 | 8 | 8 | 6 | 8 | 7 | 7 | 7 |
| "Pepper": Hot/Wet | 7 | 8 | 8 | 4 | 6 | 7 | 7 | 7 |
| "Pepper": Hot/Dry | 6 | 8 | 8 | 7 | 7 | 6 | 7 | 6 |
| "Mottle": Room Temp. | 8 | 8 | 8 | 6 | 8 | 8 | 7 | 7 |
| "Mottle": Hot/Wet | 7 | 8 | 8 | 4 | 5 | 7 | 6 | 7 |
| "Mottle": Hot/Dry | 7 | 8 | 8 | 7 | 7 | 7 | 7 | 7 |
| "Bridging": Room Temp. | 10 | 10 | 10 | 10 | 10 | 10 | 10 | 10 |
| "Bridging": Hot/Wet | 10 | 10 | 9 | 6 | 6 | 10 | 10 | 10 |
| "Bridging": Hot/Dry | 10 | 10 | 10 | 10 | 10 | 10 | 10 | 10 |
| Peel Force (g/in): R.T. | 3.3 | 4.8 | 4.6 | 4.4 | 6.1 | 3.4 | 5.7 | 5.3 |
| Peel Force (g/in): H/W | 2.7 | 5 | 5.2 | 5.3 | 5.1 | 3.1 | 4.6 | 4.5 |
| Peel Force (g/in): H/D | 4.9 | 4.9 | 5.3 | 5.4 | 6.4 | 4.8 | 5.4 | 4.9 |
| Release Strength (g/in): RT | 43.8 | 30.4 | 32.5 | 23.1 | 32.8 | 44.1 | 39.3 | 40.1 |

TABLE BB-continued

Environmental and Imaging Performance Evaluations

| EVALUATION | Control B | Example 3'* | Example 3"* | Example 3 | Example 3'"* | Example 4 | Ref. Sample B-1 | Ref. Sample B-2 |
|---|---|---|---|---|---|---|---|---|
| Release Strength (g/in): HW | 43.6 | 28.1 | 28.2 | 22.7 | 28.9 | 43.9 | 37.6 | 39.2 |
| Release Strength (g/in): HD | 119.9 | 61.3 | 76.5 | 37.4 | 63 | 116.3 | 109.9 | 111.2 |
| Relative Sensitivity .36th filter (m/s) | 9.70 | 10.00 | 9.85 | 10.25 | 10.00 | 9.75 | 9.7 | 9.75 |
| Relative Burn-Out (m/s) | 6.20 | 5.80 | 5.80 | 5.70 | 5.60 | 6.20 | 6.20 | 6.20 |
| Burn-Out Ratio | 3.58 | 3.95 | 3.89 | 4.12 | 4.09 | 3.60 | 3.60 | 3.60 |

*Examples 3', 3", 3'" differ from their pertinent counterparts only on the basis of diepoxide levels.

As used in Table BB above, the term "pepper" refers to regions of "unpulled pels" that appear to the unaided eye as black spots or black regions of non-uniformity. The term "mottle" refers to a significant, non-oriented, and non-correlated variation in image optical density. The term "bridging" refers to the loss of small, isolated islands of carbon near $D_{min}$ image areas. For each of these parameters, a loupe or microscope is used for visual examination and to confirm that existence of such conditions. For each parameter, images were graded on a scale of 0 to 10, wherein "0" indicated a severe condition and "10" indicated the absence of such condition.

In sum, the films based on the carbon-black fluids with the addition of appropriate levels of water-insoluble cycloaliphatic epoxide in isopropanol shows improved image quality and relatively flat release strength at hot/dry conditions and improved sensitivity, burn-out, and burn-out ratios across the wide range of environmental conditions.

Example 5

Embodiments of the present invention according to a configuration suitable for "graphic arts"-related imaging were prepared and evaluated. Such laminar thermal imaging media comprised the following layers in succession:

a 4.0 mil thick polyethylene terephthalate base;

a UV-curable adhesive layer coated at 13700 mg/m² (dry coverage) from a formulation comprising (@22% solids in ethyl acetate) p-methoxyphenol, Q-4 Polymer (copolymer of burylmethacrylate, butylacrylate, and dimethylaminoethyl acrylate), Irgacure 651, Irganox 1010, Irganox 1035, and trimethylolpropane triacrylate, at a solid weight ratio of 0.15/988.5/47.37/3.06/3.06/234.3;

a bridge layer coated at 2200 mg/m² (dry coverage) from a formulation comprising (@11.25% solids) Neocryl BT-520 (acrylic based polymer latex, ICI) and Aerosol OT (American Cyanamid) at a solid weight ratio of 1:0.00178;

a release layer;

a carbon black layer, with optical density of 4.0;

a tie layer comprising two layer of poly(styrene-co-acrylonitrile) each, each coated at 500 mg/m² (dry coverage); and a 1.74 mil thick polyethylene terephthalate base.

In reference examples, the release layer was coated from a formulation (@2.25% solids) comprising TEF 3170 (Teflon dispersion, from du Pont), Nyacol A-2 YY Silica, Natrosol +330, and Triton X-100 at a solid weight ratio of 0.9/1/0.1/0.0178; and the carbon black layer was coated (4.0 optical density) from a formulation (@5.0% solids) comprising Polaverse Carbon Black, V-540 polyvinyl alcohol, BDDE (10% in isopropanol), FC120 surfactant, and FC 171 surfactant at a solid weight ratio of 6/1/0.21/0.0072/0.0072, respectively.

In modified examples, the release layer was coated from a formulation comprising (@2.25% solids) TEF3170, Ludox LS YY Silica, Nat +330, Triton X-100 at a solid weight ratio of 0.9/1/0.1/0.0178; and the carbon black layer was coated from a formulation (@5.0% solids, 4.0 O.D.) comprising Polaverse Carbon Black, V-540 polyvinyl alcohol, a hydrophobic cycloaliphatic polyepoxide (Cyracure UVR-6128), FC 120 surfactant, and FC171 surfactant at a solid weight ratio of 6/1/0.21/0.0072/0.0072. Essentially, in the modified examples, the water soluble diepoxy, BDDE, of the reference examples is replaced with a water-insoluble, hydrophobic, cycloaliphatic polyepoxide, Cyracure UVR-6128 (10% in isopropanol), and the Nyacol A-2 YY silica (comparatively larger particle size) of the reference examples is replaced with Ludox LS YY silica (comparatively smaller particle size).

The carbon black layer for both the reference examples and the modified examples were coated at four different coverages: 420, 480, 545, and 605 mg/m².

The modified and reference examples were evaluated as follows:

(a) Environmental Performance: The modified examples showed improved environmental performance at 80° F./80% rel.hum. in comparison to the reference examples. Particularly, the modified examples showed 4% dots after 2 weeks (having been kept at 80° F./80% rel.hum. for 3 days) and 20% dots after 3 weeks (having been kept at 80° F./80% rel.hum. for 1 day), whereas the reference media showed >/=50% dots after 6 months. The modified examples maintained good environmental performance under room temperature, 100° F. with low rel. hum., and simulated transportation conditions (i.e., held at 120° F. and low rel. hum. for 3 days).

(b) "Age-in" at Room Temperature: The modified examples generally displayed faster "age-in" than the reference examples. Particularly, the modified media showed, 2% dots in 3 weeks at room temperature, whereas the reference media showed 4% dots in 2 months at room temperature.

(c) Good Stability: Accelerated aging tests at 120 Dry/3 Days and 80/80/3 days followed by environmentals (RT-1 day, then RT, 80/801- 1 day or 100 dry-1-day) showed imaging performance similar to or better than the reference media, indicating good long term stability (similar to or better than the reference media).

(d) Imaging Performance: Reference and modified examples were imaged by the methods described in previous examples. No significant losses in imaging performance were observed. Sensitivity, burnout, and the incidence and degree of peel force related artifacts (i.e., peel streaking and peel shadow) were similar to the reference media.

(e) Robustness: Of the four different coverage (420, 480, 545, and 605 mg/m$^2$) used to coat the carbon black formulations, three of the coverage (480, 545, and 605 mg/m$^2$) gave improved performance over the reference examples (better 80/80, and similar RT and 100 Dry). As to the release layer, coverage of 605 and 545 mg/m$^2$ gave optimum performance. With regard to accelerated aging, the modified media coated at higher and medium coverage (605 and 545 mg/m$^2$) showed background clarity better than or similar to the reference media. In comparison to the performance of the reference media, the ability of the modified media to achieve good environmental stability over a relatively broad range of environmental conditions (i.e., RT, 80/80, 100/Dry) for different coverages (480, 545, and 605 mg/m$^2$) indicates the robustness of the system.

In view of the above results, it is advanced that the addition of the hydrophobic cycloaliphatic polyepoxides (to replace or reduce BDDE content) reduces the release strength at hot/dry conditions while slightly reducing the release strength at either hot/wet conditions or room temperature. Since the reference media (with Nyacol A-2 YY silica) has hot/wet problems (release strength too weak at HW), addition of the new diepoxy into reference media does not improve its environmental performance. Earlier tests indicate that the reference media with Ludox LS YY silica (smaller particle size) can give good HW and RT but poor HD performance (release too strong at HD). Therefore addition of new diepoxy into modified media (more particularly, those employing smaller silica particles) will likely give more balanced environmental performance—improving hot/dry performance without deteriorating room temperature and hot/wet performance.

I claim:

1. A laminar imaging medium for the imagewise recordation of information, the recorded latent image being developable by laminar separation, said laminar imaging medium comprising:

first and second support sheets;

an imagewise activatable polymeric layer, the imagewise activatable layer being activatable in response to an imagewise recordation to thereby increase adhesion between said layer and a porous or particulate image-forming layer;

a plurality of fracturable layers, the plurality comprising the porous or particulate image-forming layer and a release layer, at least one of the fracturable layers being deposited from a dispersion containing a hydrophobic cycloaliphatic polyepoxide;

the porous or particulate image-forming layer disposed on the imagewise activatable layer and forming an interface therewith, the image-forming layer having cohesivity in excess of its adhesivity for the imagewise activatable layer;

the release layer disposed on the image-forming layer and forming an interface therewith such that upon laminar separation of the laminar imaging medium following activation of areas of the laminar imaging medium failure occurs in areas corresponding to the imagewise recordation within or on the surface of the release layer; and the first support sheet secured to the imagewise activatable layer and the second support sheet adhered to the face of the release layer remote from the imagewise activatable layer.

2. The laminar imaging medium of claim 1, wherein the image-forming layer comprises an image-forming colorant material in a hydrophilic polymeric binder, the image-forming layer being the fracturable layer deposited from the dispersion containing the hydrophobic cycloaliphatic polyepoxide.

3. The laminar imaging medium of claim 1, wherein the release layer comprises hygroscopic particles and a hydrophilic binder, the release layer being the fracturable layer deposited from the dispersion containing the hydrophobic cycloaliphatic polyepoxide.

4. The laminar imaging medium of claim 1, wherein the hydrophobic cycloaliphatic epoxide has the formula

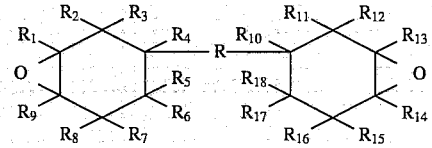

wherein $R_1$ through $R_{18}$ are hydrogen atoms, halogen atoms, or alkyl radicals containing one to nine carbon atoms; and R is —CO—O—CH$_2$—, —CH$_2$—O—CO—, or —CH$_2$—CO—R$_{19}$—CO—OCH$_2$—, R$_{19}$ being a valence bond or a divalent hydrocarbon radical containing one to twenty carbon atoms.

5. The laminar imaging medium of claim 4, wherein the hydrophobic cycloaliphatic polyepoxide is 3,4-epoxycyclohexylmethyl-3,4-epoxycyclohexane carboxylate.

6. The laminar imaging medium of claim 4, wherein the hydrophobic cycloaliphatic polyepoxide is bis-(3,4-epoxycyclohexyl) adipate.

7. The laminar imaging medium of claim 3, wherein the hygroscopic particle of the release layer is silica.

8. The laminar imaging medium of claim 2, wherein the image forming colorant of the image forming layer is carbon black.

* * * * *